United States Patent
Zhong et al.

(10) Patent No.: US 11,139,205 B2
(45) Date of Patent: Oct. 5, 2021

(54) SELF-ALIGNED SUBTRACTIVE INTERCONNECT PATTERNING

(71) Applicant: Applied Materials, Inc., Santa Clara, CA (US)

(72) Inventors: Lei Zhong, Niskayuna, NY (US); Ho-yung David Hwang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/932,974

(22) Filed: Jul. 20, 2020

(65) Prior Publication Data
US 2021/0035863 A1 Feb. 4, 2021

Related U.S. Application Data

(60) Provisional application No. 62/881,953, filed on Aug. 2, 2019.

(51) Int. Cl.
*H01L 21/768* (2006.01)
*H01L 21/02* (2006.01)

(52) U.S. Cl.
CPC .... *H01L 21/76897* (2013.01); *H01L 21/0254* (2013.01); *H01L 21/02532* (2013.01); *H01L 21/02554* (2013.01); *H01L 21/76816* (2013.01); *H01L 21/76837* (2013.01); *H01L 21/76879* (2013.01)

(58) Field of Classification Search
CPC ......... H01L 21/02107; H01L 21/02225; H01L 21/02436; H01L 21/02458; H01L 21/02472; H01L 21/02518; H01L 21/02521; H01L 21/02532; H01L 21/0254; H01L 21/02554; H01L 21/31144; H01L 21/3115; H01L 21/32; H01L 21/64; H01L 21/71; H01L 21/768; H01L 21/76802; H01L 21/76837; H01L 21/76877; H01L 21/76879; H01L 21/76885; H01L 21/76895; H01L 21/76897; C23C 16/04; C23C 16/042; C23C 16/44
See application file for complete search history.

(56) References Cited

U.S. PATENT DOCUMENTS 8,637,406 B1 * 1/2014 Jung ................. H01L 21/32139
438/703

\* cited by examiner

*Primary Examiner* — Cheung Lee
(74) *Attorney, Agent, or Firm* — Servilla Whitney LLC

(57) ABSTRACT

Described are semiconductor devices, methods of manufacturing, and methods for device patterning. More particularly, a subtractive interconnect patterning method is described. A subtractive interconnect patterning is used in place of damascene interconnect patterning.

20 Claims, 19 Drawing Sheets

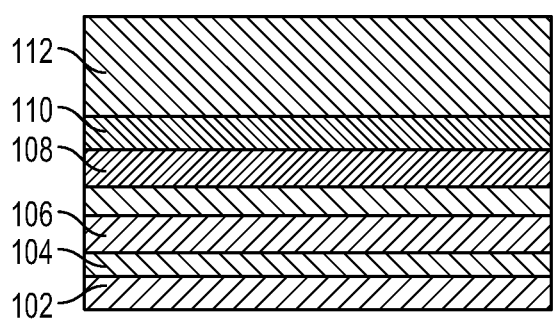
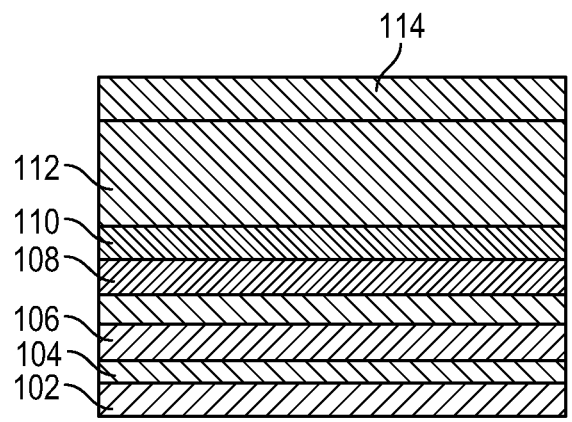
FIG. 1A          FIG. 1B
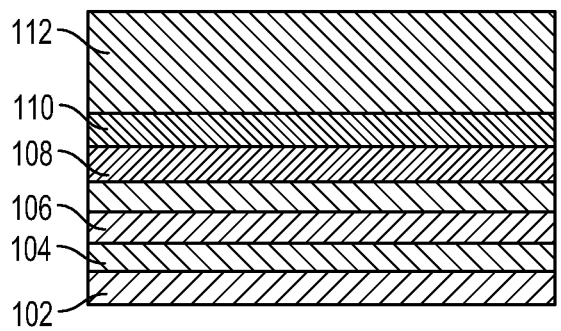
FIG. 1C
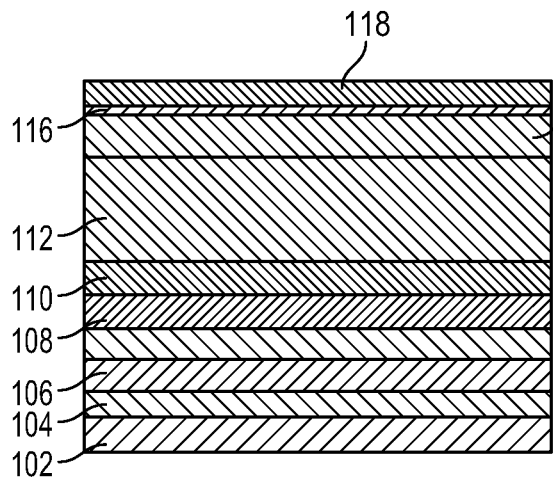
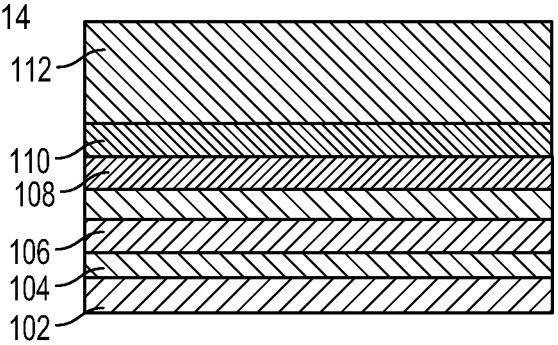
FIG. 1D          FIG. 1E

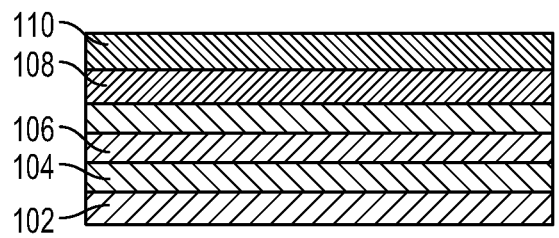
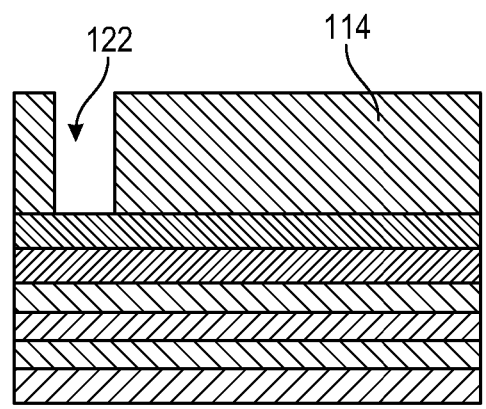
FIG. 3A    FIG. 3B
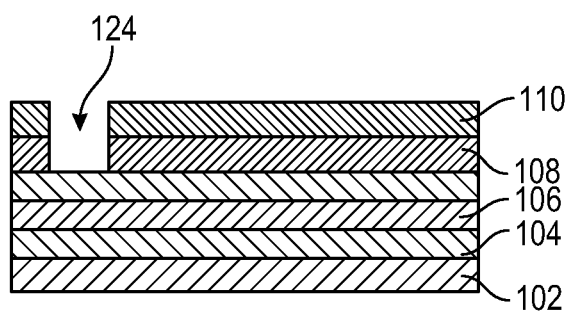
FIG. 3C
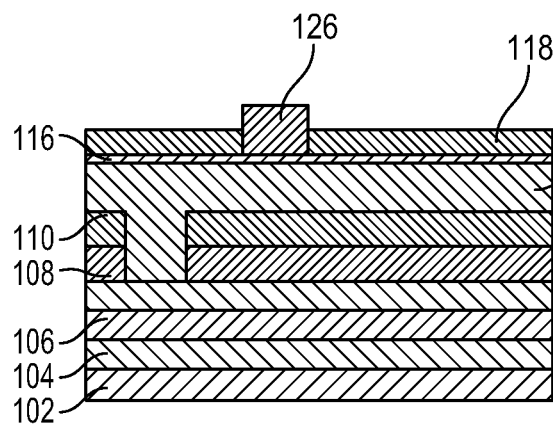
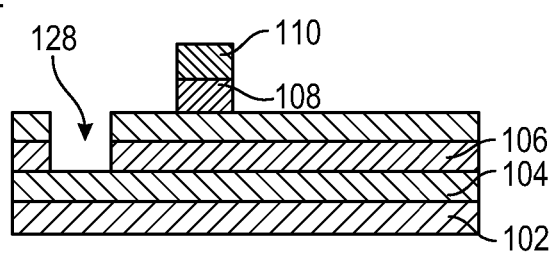
FIG. 3D    FIG. 3E

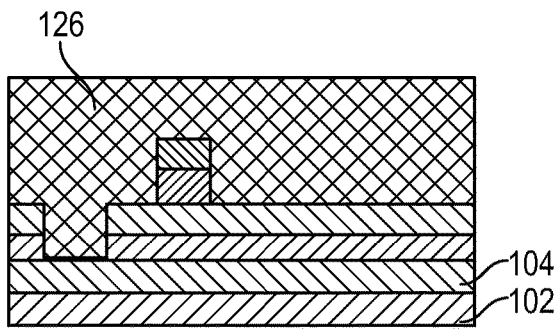
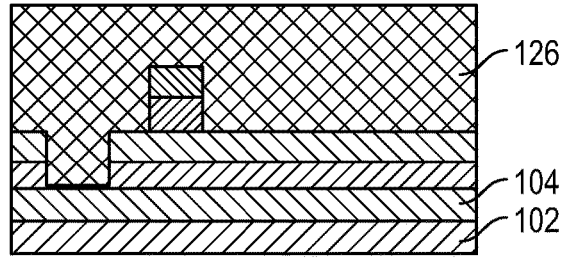
FIG. 7A    FIG. 7B
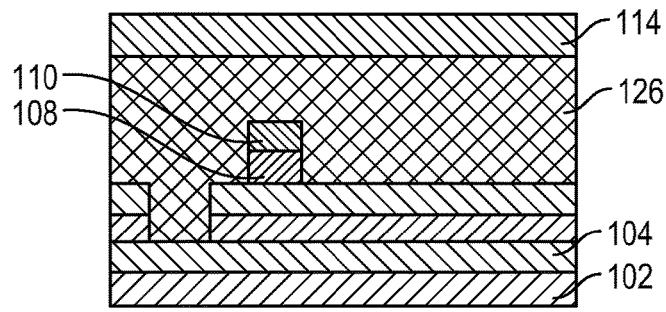
FIG. 7C
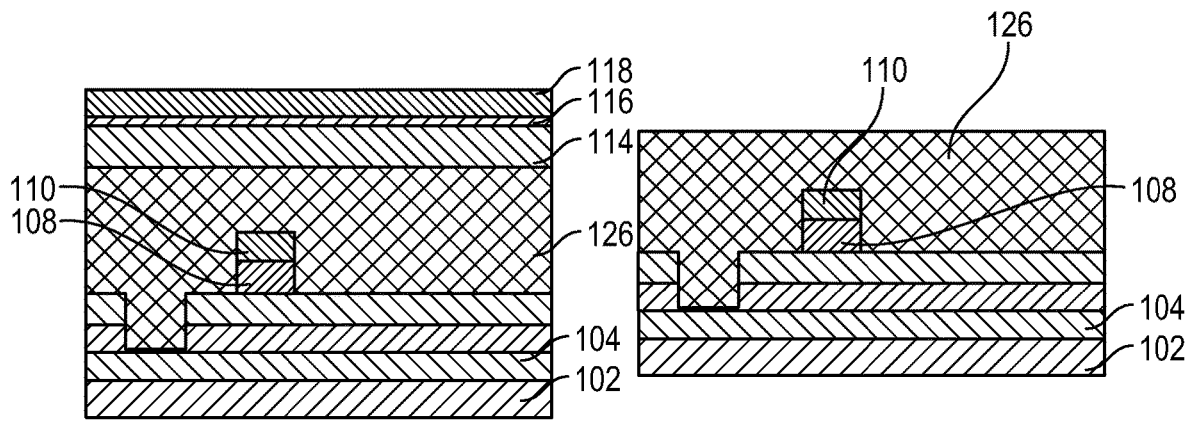
FIG. 7D    FIG. 7E

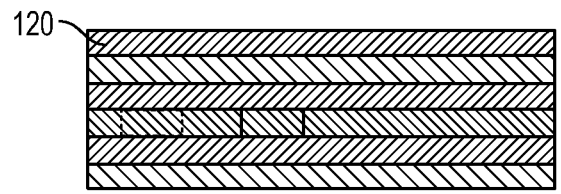
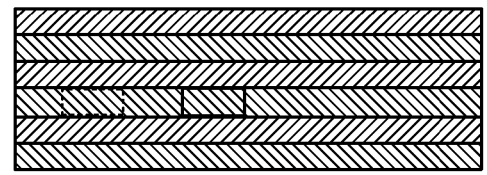
FIG. 8A                FIG. 8B
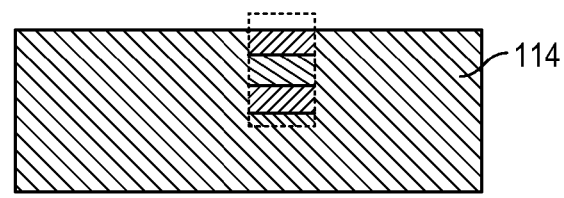
FIG. 8C
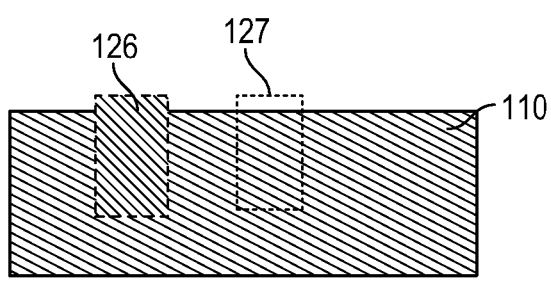
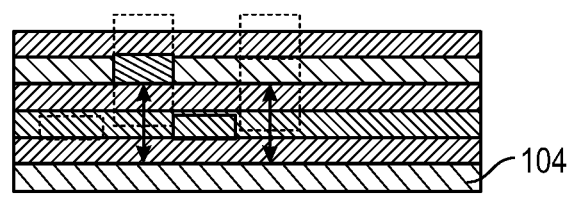
FIG. 8D                FIG. 8E

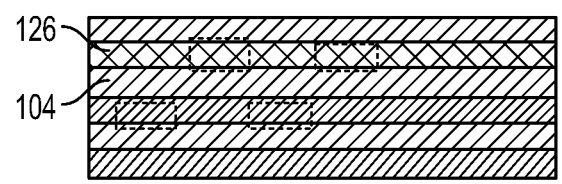
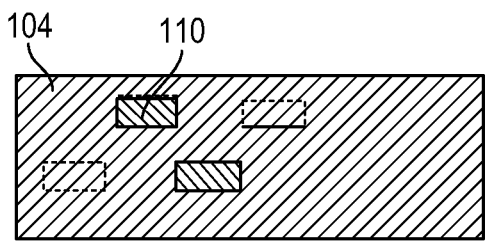
FIG. 16A          FIG. 16B
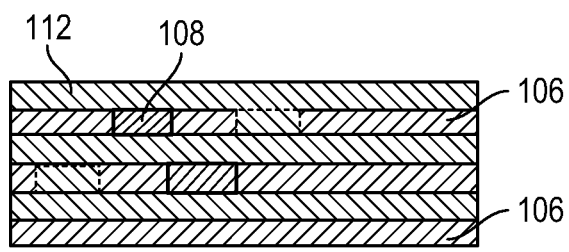
FIG. 16C
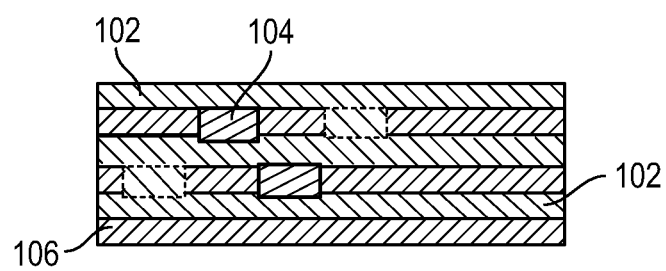
FIG. 16D
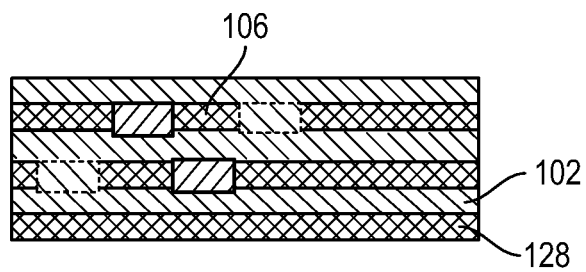
FIG. 16E

SELF-ALIGNED SUBTRACTIVE INTERCONNECT PATTERNING

CROSS-REFERENCE TO RELATED APPLICATIONS

This application claims priority to U.S. Provisional Application No. 62/881,953, filed Aug. 2, 2019, the entire disclosure of which is hereby incorporated by reference herein

TECHNICAL FIELD

Embodiments of the present invention pertain to the field of semiconductor device manufacturing and methods for device patterning. In particular, embodiments are directed to a subtractive interconnect patterning method.

BACKGROUND

Reducing the size of integrated circuits (ICs) results in improved performance, increased capacity, and/or reduced cost. Each size reduction requires more sophisticated techniques to form the ICs. Shrinking transistor size, for example, allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of ICs, multi-gate transistors have become more prevalent as device dimensions continue to scale down. Scaling multi-gate transistors has not been without consequence, however. As the dimensions of these fundamental building blocks of microelectronic circuitry are reduced, and as the number of building blocks fabricated in a given region increases, the constraints on the lithographic processes used to pattern these building blocks becomes overwhelming.

Photolithography is commonly used to pattern ICs on a substrate. An exemplary feature of an IC is a line of a material which may be a metal, semiconductor, or insulator. Due to factors such as optics and light or radiation wavelength, however, photolithography techniques are restricted by a minimum pitch, below which a particular photolithographic technique may not reliably form features. Thus, the minimum pitch of a photolithographic technique can limit feature size reduction of ICs.

Processes such as self-aligned double patterning (SADP), self-aligned quadruple patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE processes to perform device patterning. As the feature size decreases, pitch and linewidth also decrease.

It is generally accepted that a production worthy patterning scheme at advanced technology nodes must be self-aligned and the edge placement error (EPE) budget maximized. The need for EPE budget maximization and self-alignment is imperative for both via formation, as well as metal line block cuts in the case of 1-D or direction preferred patterning. Accordingly, there is a need for a patterning scheme that maximized EPE budget and is self-aligned.

SUMMARY

One or more embodiments of the disclosure are directed to a method of forming a semiconductor device. The method comprises: forming a first set and second set of mandrel and spacer lines extending along a first direction on a film stack comprising a metal stack with a hard mask stack on the metal stack, each of the first set and second set of mandrel and spacer lines including a mandrel line with a spacer line on either side thereof, the first set and second set separated by a gap exposing a top surface of the hard mask stack; memorizing a first cut location into a first material of the hard mask stack; forming a second hard mask to protect the first cut location and define a via location spaced a distance along the first direction from the first cut location; removing the second hard mask and extending the first cut location into a second material of the hard mask stack, the second material etch selective to the first material and spaced from the first material by a dielectric material, and memorize the via location in the first material; depositing a material in the gap between the first set and second set of mandrel and spacer lines; removing the mandrel lines from the first set and second set of mandrel and spacer lines to form mandrel openings; memorizing a second cut location into the first material of the hard mask stack; forming a third hard mask to protect the second cut location and define a second via location spaced a distance along the first direction from the second cut location; removing the third hard mask and extending the second cut location into the second material of the hard mask stack and memorize the second via location in the first material; forming replacement mandrel lines in the mandrel openings; and removing the spacer lines, first material, dielectric material and second material of the hard mask stack to form a trench between the first cut location and second cut locations.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A-1E are cross-sectional views of a substrate according to one or more embodiments;

FIGS. 3A-3E are cross-sectional views of a substrate according to one or more embodiments;

FIGS. 7A-7E are cross-sectional views of a substrate according to one or more embodiments;

FIGS. 8A-8E are top views of a substrate according to one or more embodiments;

FIGS. 16A-16E are top views of a substrate according to one or more embodiments;

DETAILED DESCRIPTION

Figure 2A:
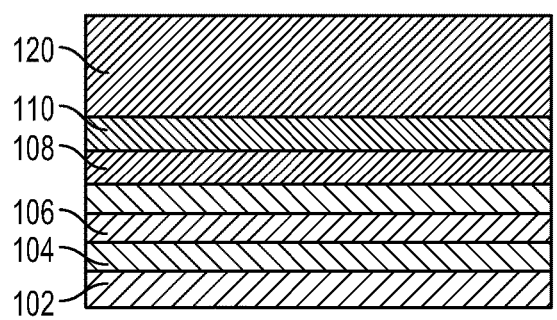
FIGS. 2A-2E are cross-sectional view of a substrate according to one or more embodiments.
Figure 2B:
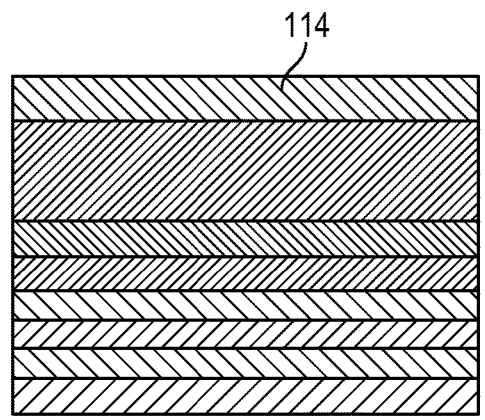
Figure 2C:
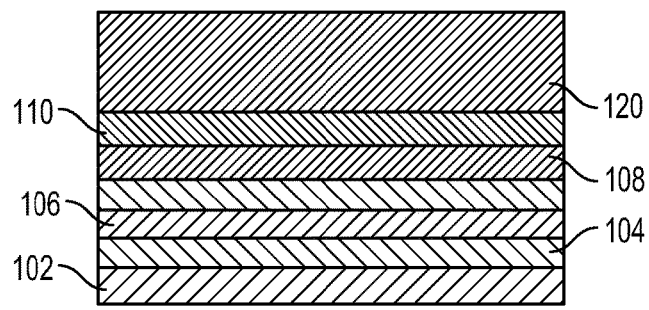
Figure 2D:
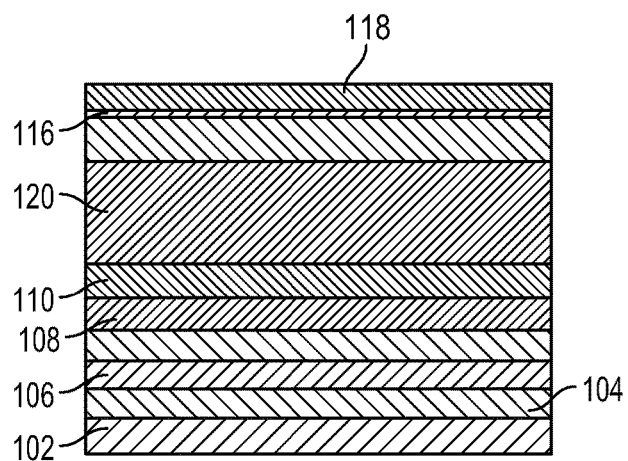
Figure 2E:
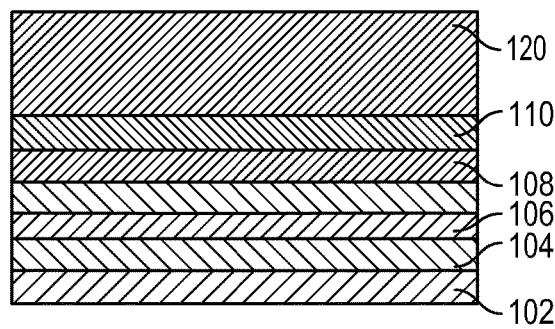
Figure 4A:
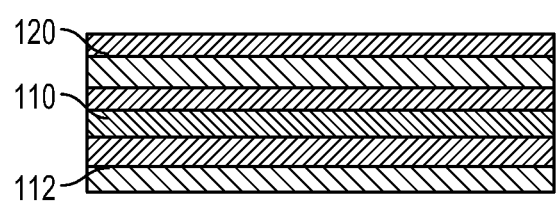
FIGS. 4A-4E are top views of a substrate according to one or more embodiments.
Figure 4B:
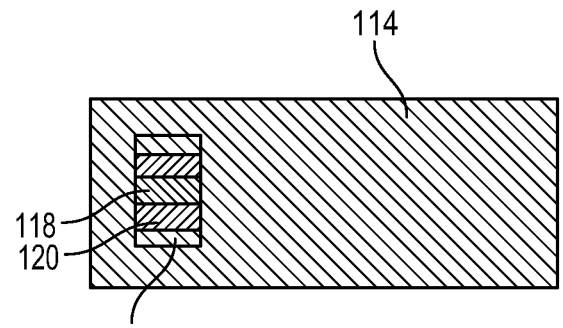
Figure 4C:
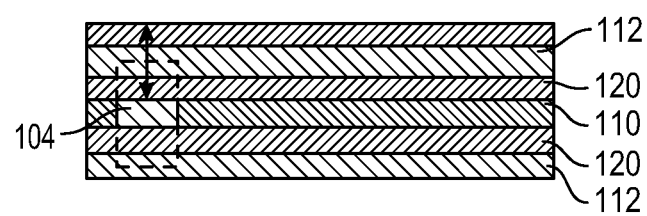
Figure 4D:
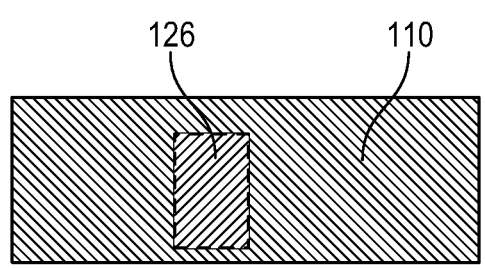
Figure 4E:
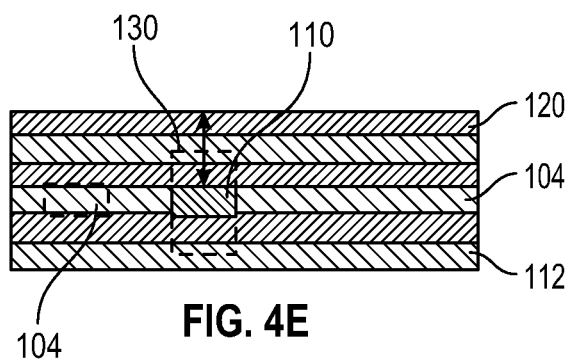
Figure 5A:
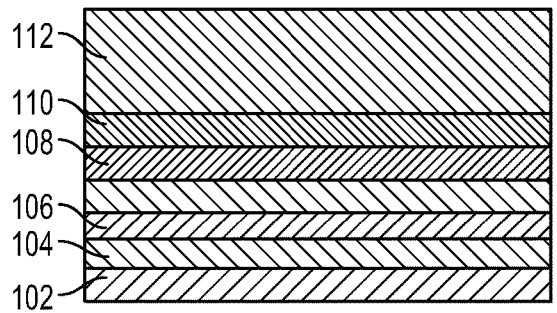
FIGS. 5A-5E are cross-sectional views of a substrate according to one or more embodiments.
Figure 5B:
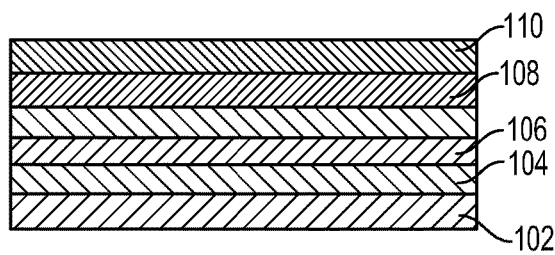
Figure 5C:
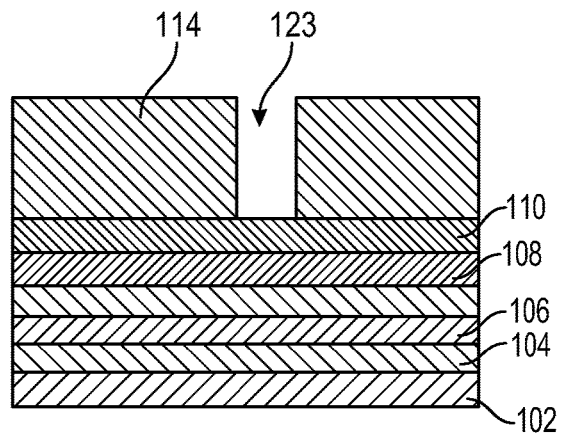
Figure 5:
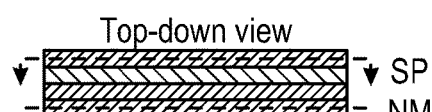
FIG. 5 is a top view of a substrate according to one or more embodiments.
Figure 5D:
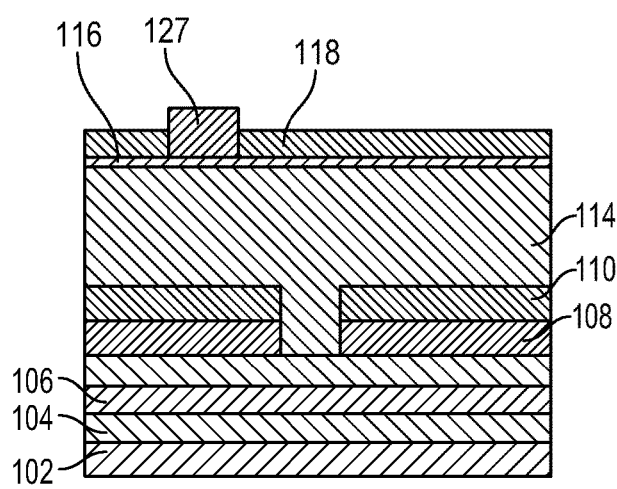
Figure 5E:
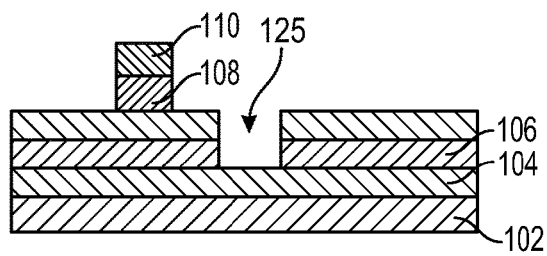
Figure 6A:
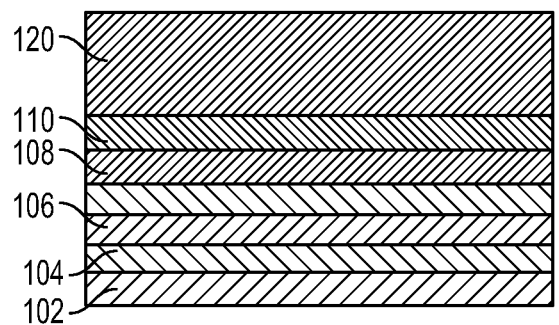
FIGS. 6A-6E are cross-sectional views of a substrate according to one or more embodiments.
Figure 6B:
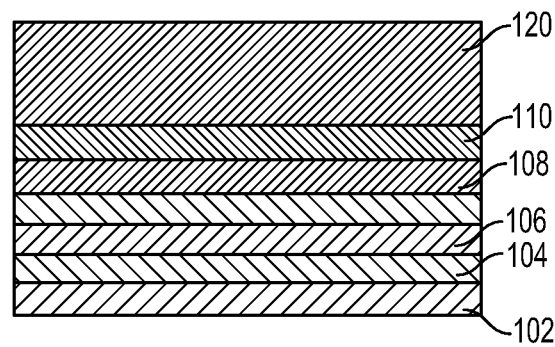
Figure 6C:
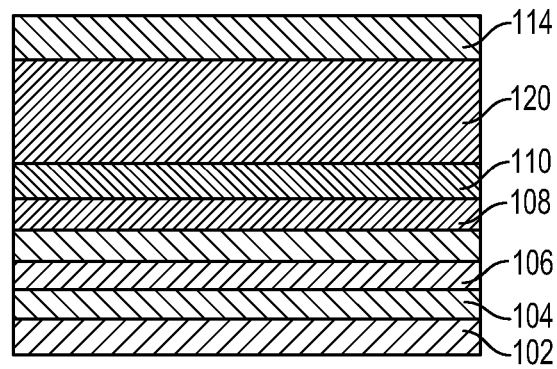
Figure 6D:
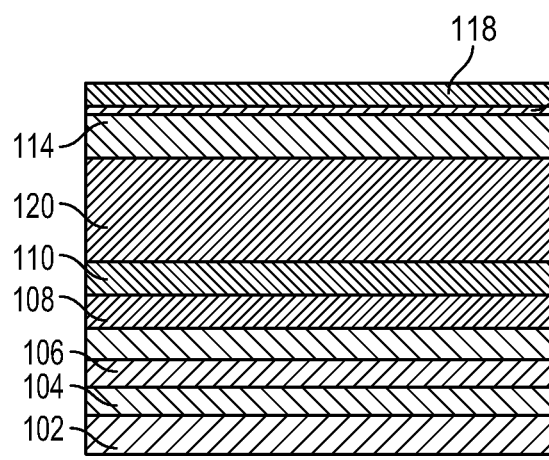
Figure 6E:
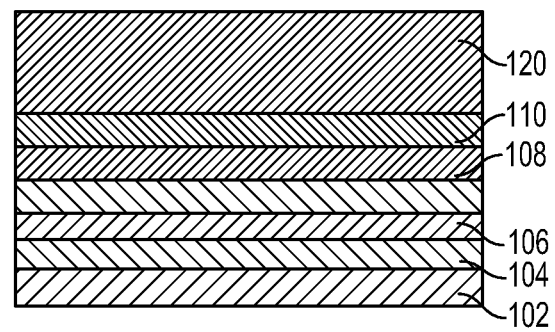

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

As used in this specification and the appended claims, the term "linewidth" refers to the width of the line of a material which may be a metal, semiconductor, or insulator, and the term "spacing" refers to the distance between adjacent lines. As used in this specification and the appended claims, the term "pitch" is defined as the distance between a same point on two adjacent lines. The pitch is equal to the sum of the linewidth and the spacing.

It is generally accepted that a production worthy patterning scheme at advanced technology nodes must be self-aligned and the edge placement error (EPE) budget maximized. The need for EPE budget maximization and self-alignment is imperative for both via formation, as well as metal line block cuts in the case of 1-D or direction preferred patterning. There is also a trend of interconnect material migrating from copper (Cu), which has a low intrinsic resistivity, towards ruthenium (Ru), cobalt (Co), molybdenum (Mo), and nickel (Ni), which are more desirable from the scalability perspective at sub-5 nm nodes and below, as the mean electron free path is shorter and barrier-less metallization is possible.

In one or more embodiments, a subtractive interconnect patterning is used in place of damascene interconnect patterning, which is prevailing in the copper era due to lack of volatile etching by-products.

In one or more embodiments, a multi-stack memorizing hardmask (MmHM) is described. A multi-stack memorizing hardmask (MmHM) enables taking full advantage of self-aligned double patterning (SADP) inherent coloring to maximize EPE budget for both via and block-cut patterning. More specifically, in one or more embodiments, a block-cut pattern is split into two masks, with one associated with mandrel (MN, also known as the core), and the other associated with the non-mandrel (NM, also known as the gap). Likewise, in one or more embodiments, a via pattern is decomposed, too. The non-mandrel portion cut and via masks are then sequentially transferred into and temporarily stored in the lower and upper memorizing hardmask stacks. Subsequently, in one or more embodiments, the pattern transfer is conducted for the mandrel portion.

In one or more embodiments, once the via pattern and block cut pattern are transferred and stored in the multi-stack memorizing hardmask (MmHM), through the non-mandrel (NM) and the mandrel (MN), the stored patterns are subsequently protected by a gap-fill. Particularly, in one or more embodiments, the SADP mandrel, which is removed to allow for the access to the multi-stack memorizing hardmask (MmHM) under SADP for via and block cut patterning, is gap-filled with a material different than the original. In one or more embodiments, the gap-filled mandrel is called the replacement mandrel (rMN). In one or more embodiments, the replacement mandrel (rMN) and non-mandrel (NM) gap-fill are chosen to be identical material with a sharp material contrast than the SADP spacer. Together, in one or more embodiments, the replacement mandrel (rMN) along with the gap-filled non-mandrel (NM) enables selective removal of the SADP spacer to provide a "tone reverse," and, consequently, the integration of a self-aligned EPE budget maximized subtractive Mx process flow.

In one or more embodiments, the process flow involves film stack preparation, SADP pitch splitting, block cut and pattern memorizing, replacement mandrel, and subtractive metal etch. More specifically, in one or more embodiments, $V_x/M_x$ stack: with etch stop layer in between is formed. Then, the multi-stack memorizing hardmask (MmHM) stacks are formed having a lower hardmask (HM) stack and an upper hardmask (HM stack). The SADP mandrel film is then formed. Mask $M_{x-0}$ mandrel (MN) formation followed by spacer (SP) deposition and etch-back. Mask block-cut the non-mandrel (NM) portion $M_{x-C1}$; memorized by hardmask (HM). Mask via the non-mandrel (NM) portion $V_{x-1}$; memorized by hardmask (HM). Then, in one or more embodiments, non-mandrel (NM) gap-fill/CMP followed by mandrel (MN) removal. Mask block-cut the mandrel (MN) portion $M_{x-C2}$; memorized by hardmask (HM). Mask via the non-mandrel (NM) portion $V_{x-2}$; memorized by hardmask (HM). Mandrel gap-fill/CMP. Spacer removal (tone reverse). Trench formation in the hardmask (HM). Cut pattern transferred into $V_x$. Cut pattern transferred into $M_x$; concurrently via into $V_x$ Low-K gap fill and CMP.

The figures illustrate various views of the process flow according to one or more embodiments. FIGS. 1A-1E are cross-sectional views of a substrate taken along the mandrel (MN, also known as the core) according to one or more embodiments. FIGS. 2A-2E are cross-sectional views taken long the spacer according to one or more embodiments. FIGS. 3A-3E are cross-sectional views taken along the non-mandrel (NM, also known as the gap). FIGS. 4A-4E are top down views of the substrate according to one or more embodiments.

Referring to FIGS. 1A, 2A, 3A, and 4A the film stack is prepared. The film stack comprises a $V_x/M_x$ stack 102, with a silicon oxynitride (SiON) layer 104 on a top surface of the stack 102. A titanium nitride (TiN) layer 106 is on a top surface of the silicon oxynitride (SiON) layer 104. An aluminum oxide layer 108 is on a top surface of the titanium nitride (TiN) layer 106. A silicon nitride layer 110 is on a top surface of the aluminum oxide layer 108. A mandrel 112 is on a top surface of the silicon nitride layer 110. In one or more embodiments, the mandrel 112 may comprise any suitable material. In some embodiments, the mandrel comprises one or more of an organic planarizing layer (OPL), an advanced pattern film (APF), amorphous silicon, or a spin-on hardmask (SOH). In some embodiments, the APF includes chemical vapor deposition (CVD) amorphous carbon film or Si film. A spacer 120 is on the silicon nitride layer 110. In one or more embodiments, spacer 120 may comprise any suitable material known to the skilled artisan. In some embodiments, spacer 120 may comprise amorphous silicon, silicon oxide, silicon nitride or metal oxide.

Referring to FIGS. 1B, 2B, 3B, and 4B a mask 114 is formed on the film stack, and an opening 122 is formed in the mask 114. The mask 114 may comprise any suitable material and may be deposited by any suitable technique known to the skilled artisan, including, but not limited to, atomic layer deposition (ALD) and chemical vapor deposition (CVD). The opening 122 may be formed by any suitable technique known to the skilled artisan including, but not limited to, etching.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. aluminum precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

Referring to FIGS. 1C, 2C, 3C, and 4C the mask 114 is removed and the opening 122 is transferred to the silicon nitride layer 110 and the aluminum oxide layer 108 to form an opening 124.

Referring to FIGS. 1D, 2D, 3D, and 4D a mask layer 114 is deposited and fills opening 124. A barrier layer 116 is formed on a top surface of the mask layer 114, and a silicon nitride layer 118 is formed on a top surface of the barrier layer 116. A via 126 ($V_{x-1}$) is formed in the silicon nitride layer 118 on the top surface of the barrier layer 116.

Referring to FIGS. 1E, 2E, 3E, and 4E the mask layer 114 is removed and opening 124 is transferred to silicon oxynitride layer 104 and titanium nitride layer 106 to form opening 128. Via 126 is transferred to a top surface of silicon oxynitride layer 104.

The figures illustrate various views of the process flow according to one or more embodiments. FIGS. 5A-5E are cross-sectional views of a substrate taken along the mandrel (MN, also known as the core) according to one or more embodiments. FIGS. 6A-6E are cross-sectional views taken long the spacer according to one or more embodiments. FIGS. 7A-7E are cross-sectional views taken along the non-mandrel (NM, also known as the gap). FIGS. 8A-8E are top down views of the substrate according to one or more embodiments.

Referring to FIGS. 5A, 6A, 7A, and 8A, a gap fill layer 126 is deposited and fills opening 124, and then layer 126 is removed by one or more of chemical mechanical planarization (CMP) except in the filled opening 124. The gap-fill material 126 may be but not limited to flowable CVD (FCVD) silicon oxide or FCVD silicon. The film stack comprises a $V_x/M_x$ stack 102, with a silicon oxynitride (SiON) layer 104 on a top surface of the stack 102. A titanium nitride (TiN) layer 106 is on a top surface of the silicon oxynitride (SiON) layer 104. An aluminum oxide layer 108 is on a top surface of the titanium nitride (TiN) layer 106. A silicon nitride layer 110 is on a top surface of the aluminum oxide layer 108. A mandrel 112 is on a top surface of the silicon nitride layer 110. In one or more embodiments, the mandrel 112 may comprise any suitable material. In some embodiments, the mandrel comprises APF. A spacer 120 is on the silicon nitride layer 110.

Referring to FIGS. 5B, 6B, 7B, and 8B the mandrel 112 is removed. In one or more embodiments, the mandrel 112 may be removed by any suitable technique known to one of skill in the art. In one or more embodiments, the mandrel 112 is removed by one or more of selective removal or etching.

Referring to FIGS. 5C, 6C, 7C, and 8C, a mask layer 114 is deposited on the silicon nitride layer 110 and the mask is block-cut to form opening 123 ($M_{x-C2}$), which is memorized by the hard mask 114. Layer 114 may be comprised of a spin-on organic-planarization material.

Referring to FIGS. 5D, 6D, 7D, and 8D, the block-cut opening 123 ($M_{x-C2}$) is transferred into hardmask stack 110 and 108, and then the opening is filled with organic planarization gap fill material 114. A barrier layer 116 is formed on a top surface of the mask layer 114, and a silicon nitride layer 118 is formed on a top surface of the barrier layer 116. A via 127 ($V_{x-1}$) is formed in the silicon nitride layer 118 on the top surface of the barrier layer 116.

Referring to FIGS. 5E, 6E, 7E, and 8E the via 127 is transferred to the mask layer 114 and then opening 123 is transferred to silicon oxynitride layer 104 and titanium nitride layer 106 to form opening 125. Via 127 is transferred to silicon nitride layer 110 and aluminum oxide layer 108.

Figure 9A:
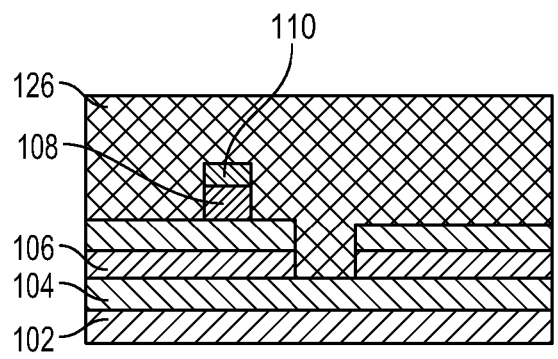
FIGS. 9A-9C are cross-sectional views of a substrate according to one or more embodiments.
Figure 9B:
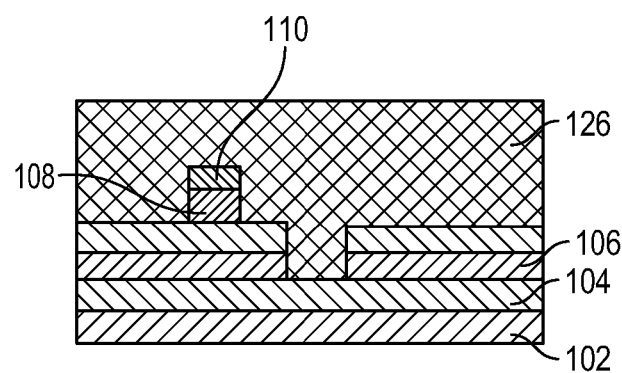
Figure 9C:
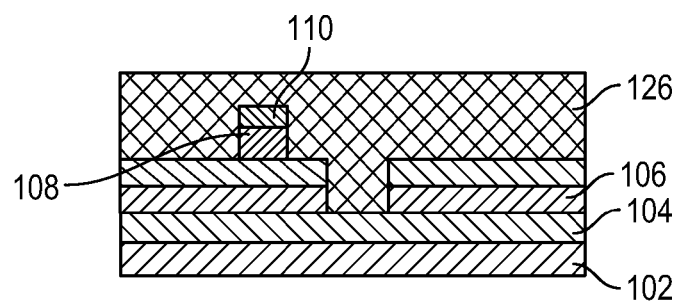
Figure 9:
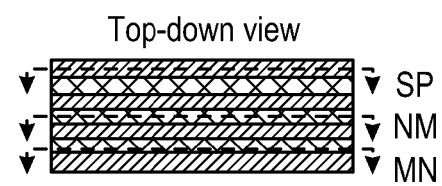
FIG. 9 is a top down view of a substrate according to one or more embodiments.
Figure 10A:
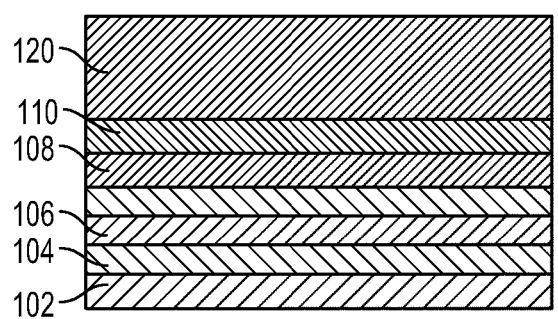
FIGS. 10A-10C are cross-sectional views of a substrate according to one or more embodiments.
Figure 10B:
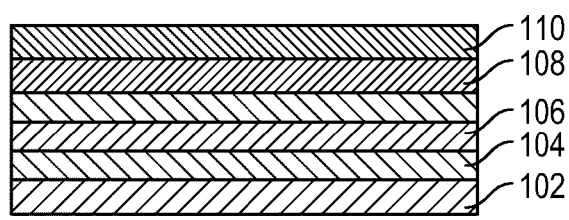
Figure 10C:
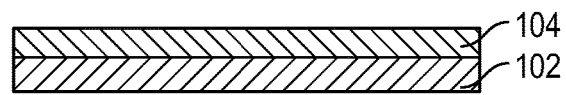
Figure 11A:
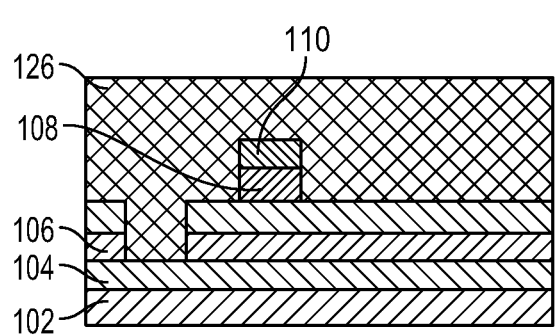
FIGS. 11A-11C are cross-sectional views of a substrate according to one or more embodiments.
Figure 11B:
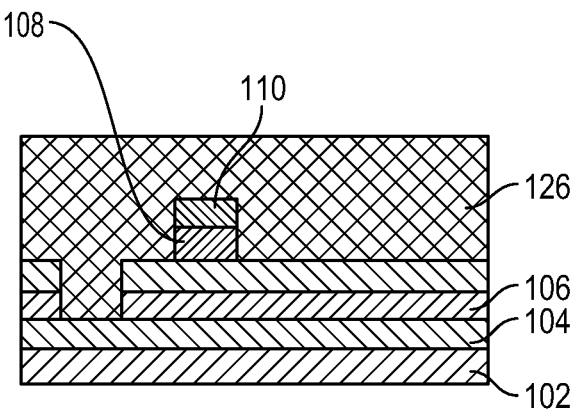
Figure 11C:
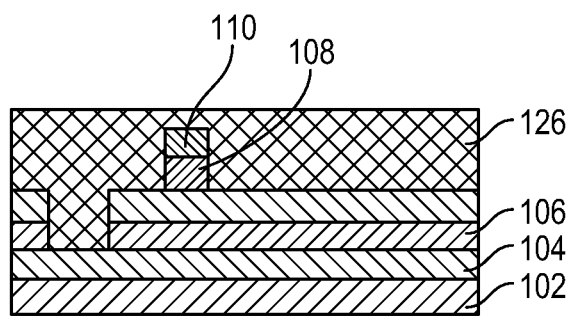
Figure 13A:
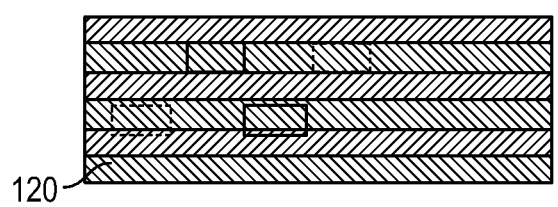
FIGS. 13A-13C are top views of a substrate according to one or more embodiments.
Figure 13B:
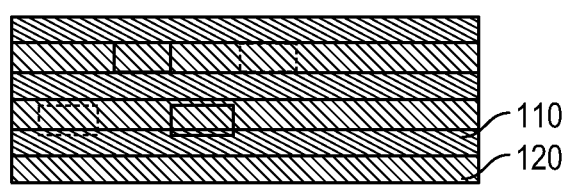
Figure 13C:
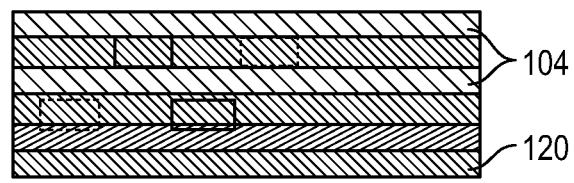
Figure 14A:
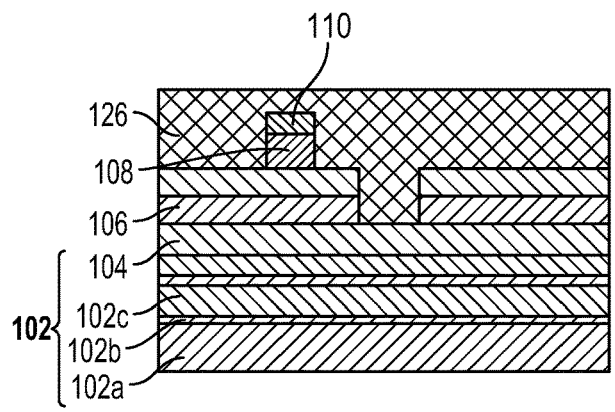
FIGS. 14A-14E are cross-sectional views of a substrate according to one or more embodiments.
Figure 14B:
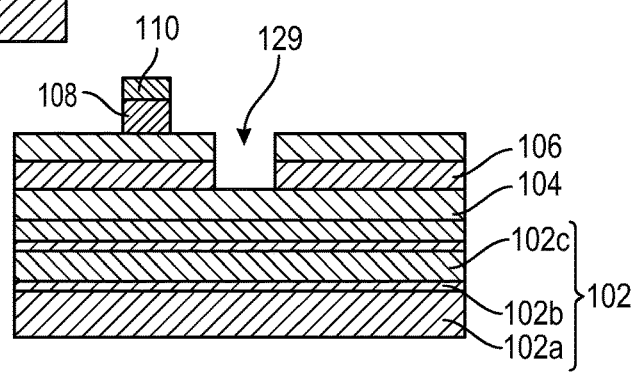
Figure 14C:
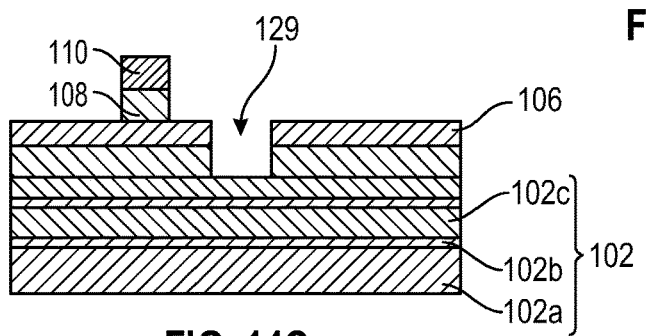
Figure 14D:
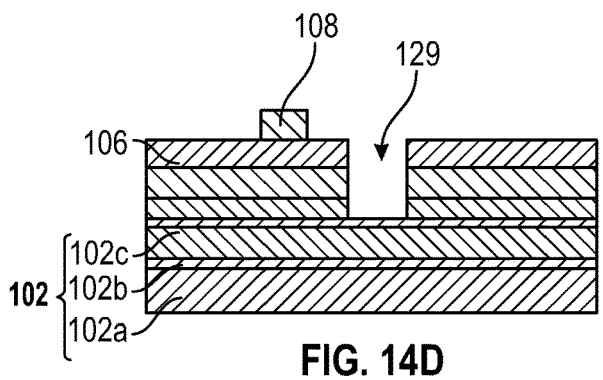
Figure 14E:
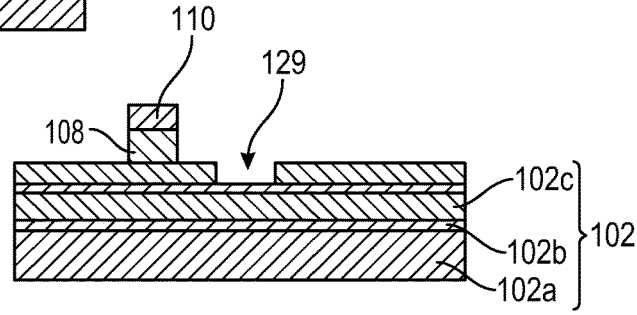
Figure 15A:
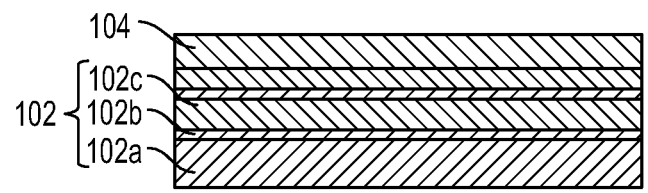
FIGS. 15A-15E are cross-sectional views of a substrate according to one or more embodiments.
Figure 15B:
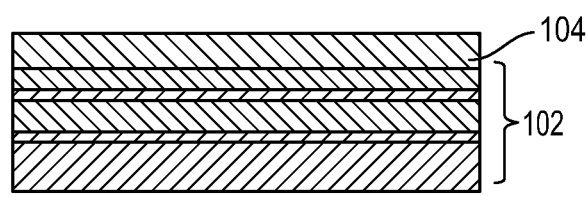
Figure 15C:
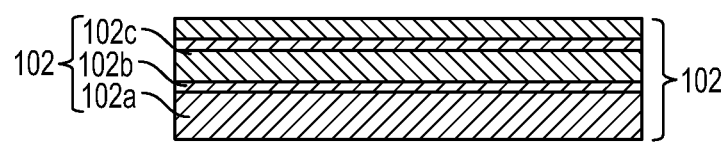
Figure 15D:
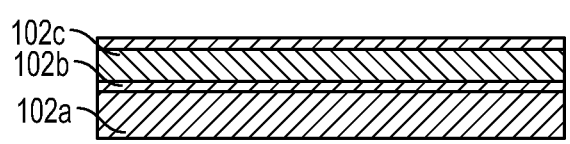
Figure 15E:
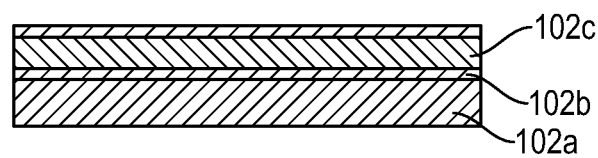
Figure 17A:
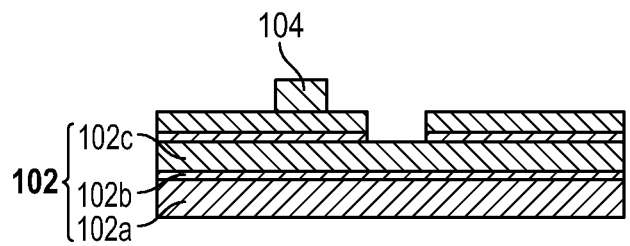
FIGS. 17A-17E are cross-sectional views of a substrate according to one or more embodiments.
Figure 17B:
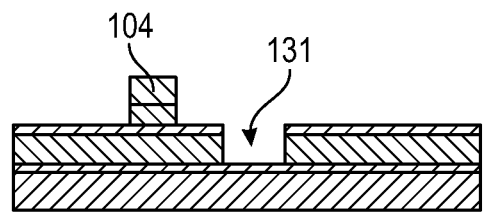
Figure 17C:
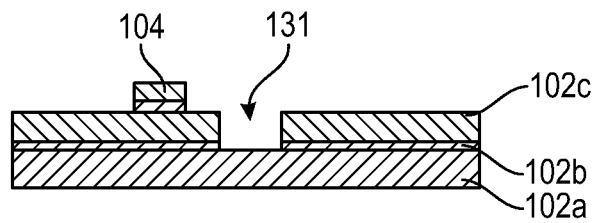
Figure 17D:
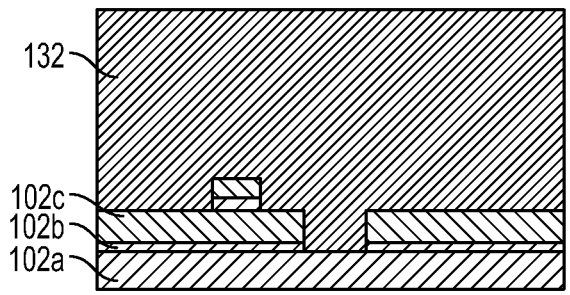
Figure 17E:
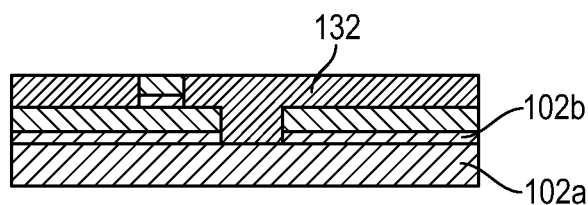
Figure 18A:
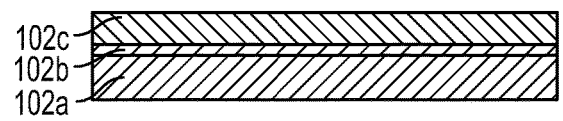
FIGS. 18A-18E are cross-sectional views of a substrate according to one or more embodiments.
Figure 18B:
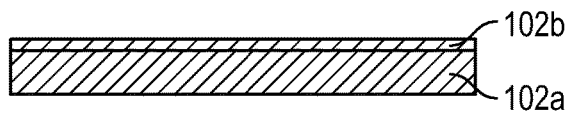
Figure 18C:
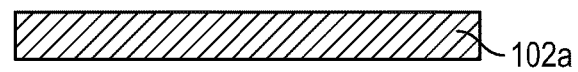
Figure 18D:
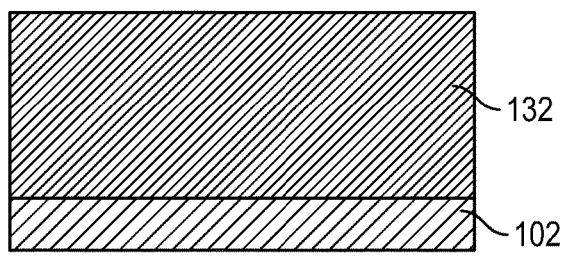
Figure 18E:
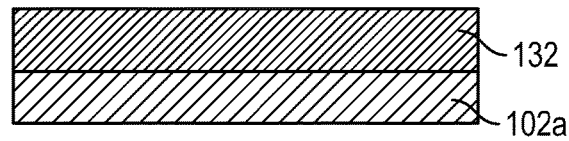
Figure 19A:
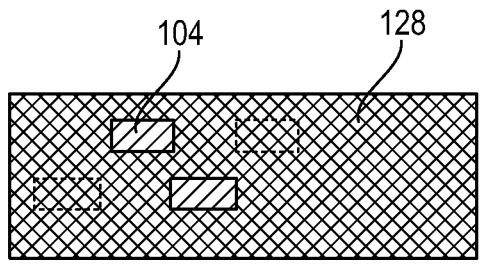
FIGS. 19A-19E are top views of a substrate according to one or more embodiments.
Figure 19B:
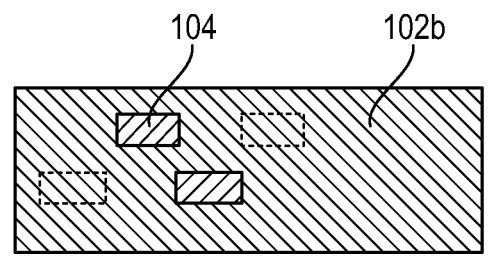
Figure 19C:
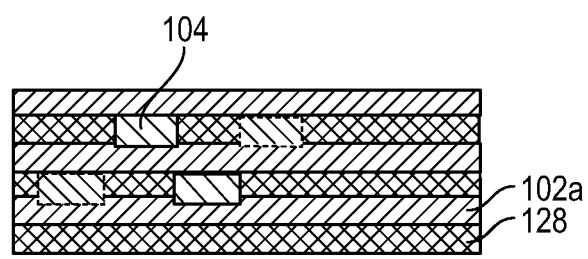
Figure 19D:
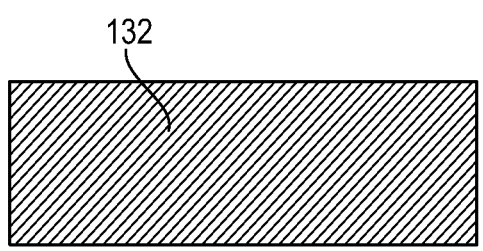
Figure 19E:
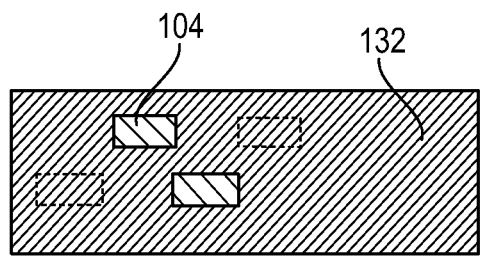

The figures illustrate various views of the process flow according to one or more embodiments. FIGS. 9A-9C are cross-sectional views of a substrate taken along the mandrel (MN, also known as the core) according to one or more embodiments. FIGS. 10A-10C are cross-sectional views taken long the spacer according to one or more embodiments. FIGS. 11A-11C are cross-sectional views taken along the non-mandrel (NM, also known as the gap). FIGS. 13A-13C are top down views of the substrate according to one or more embodiments.

Referring to FIGS. 9, 9A, 10A, 11A, and 13A, a gap fill layer 126 is deposited and fills opening 125. In some embodiments, the gap fill layer 126 is planarized and is called the replacement mandrel. The gap fill material 126 may be essentially the same as the material 126 used to fill the non-mandrel (NM) gap shown in FIG. 7.

Figure 12:
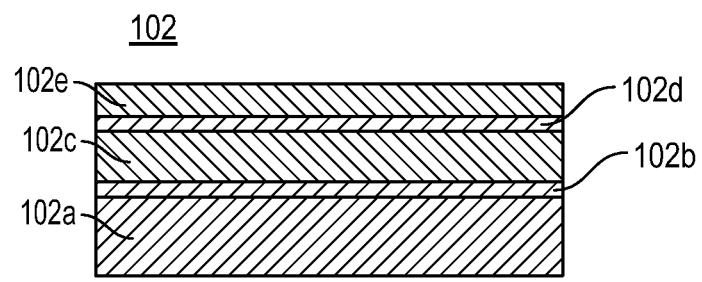
FIG. 12 is an enlarged cross-sectional view of a portion of a substrate according to one or more embodiments.

FIG. 12 is an enlarged cross-section view of the a $V_x/M_x$ stack 102. The a $V_x/M_x$ stack 102 comprises a stack of layers. In one or more embodiments, the layers comprise one or more of a tetraethylorthosilicate (TEOS) layer 102a, a barrier layer 102b, a first metallization layer 102c, a second barrier layer 102d, and a second metallization layer 102e. In some embodiments, the first metallization layer 102c comprises ruthenium (Ru), and the second metallization layer 102e comprises a via metal, e.g. ruthenium (Ru). In other embodiments, the first metallization layer 102c and the second metallization layer 102e independently comprise ruthenium (Ru), tungsten (W), cobalt (Co), copper (Cu), or any conductive materials. In some embodiments, one of more of the first barrier layer 102b and the second barrier layer 102d comprises tantalum (Ta), tantalum nitride (TaN), titanium (Ti), titanium nitride (TiN), or any low resistivity material known to the skilled artisan.

Referring to FIGS. 9B, 10B, 11B, and 13B, the spacer 120 is removed. The spacer may be removed by any suitable technique known to the skilled artisan, including, but not limited to, plasma etching or selective removal.

Referring to FIGS. 9C, 10C, 11C, and 13C, the replacement mandrel makes the mandrel/non-mandrel contrast disappear, allowing spacer pull and $V_x/M_x$ access to define $M_x$ trench, as shown in FIGS. 10A, B, and C. The spacer may be removed by plasma etching or selective removal process. The trench may be etched into the hardmask stack 110, 108 and 106, as shown in FIG. 10C.

The figures illustrate various views of the process flow according to one or more embodiments. FIGS. 14A-14E are cross-sectional views of a substrate taken along the mandrel and/or non-mandrel according to one or more embodiments. FIGS. 15A-15E are cross-sectional views taken long the spacer according to one or more embodiments. FIGS. 16A-16E are top down views of the substrate according to one or more embodiments.

Referring to FIGS. 14A-14E, 15A-15E, and 16A-16E the cut pattern 129 is transferred into $V_x$, the via pattern is memorized into the bottom hard mask stack 110 and 108.

The figures illustrate various views of the process flow according to one or more embodiments. FIGS. 17A-17E are cross-sectional views of a substrate taken along the mandrel/non-mandrel according to one or more embodiments. FIGS. 18A-18E are cross-sectional views taken long the spacer according to one or more embodiments. FIGS. 19A-19E are top down views of the substrate according to one or more embodiments.

Referring to FIGS. 17A-17E, 18A-18E, and 19A-19E the cut pattern 131 and the via pattern 104 are transferred into the final device $M_x$ and $V_x$ layers, respectively, followed bylow-K gap fill and planarization.

Figure 20:
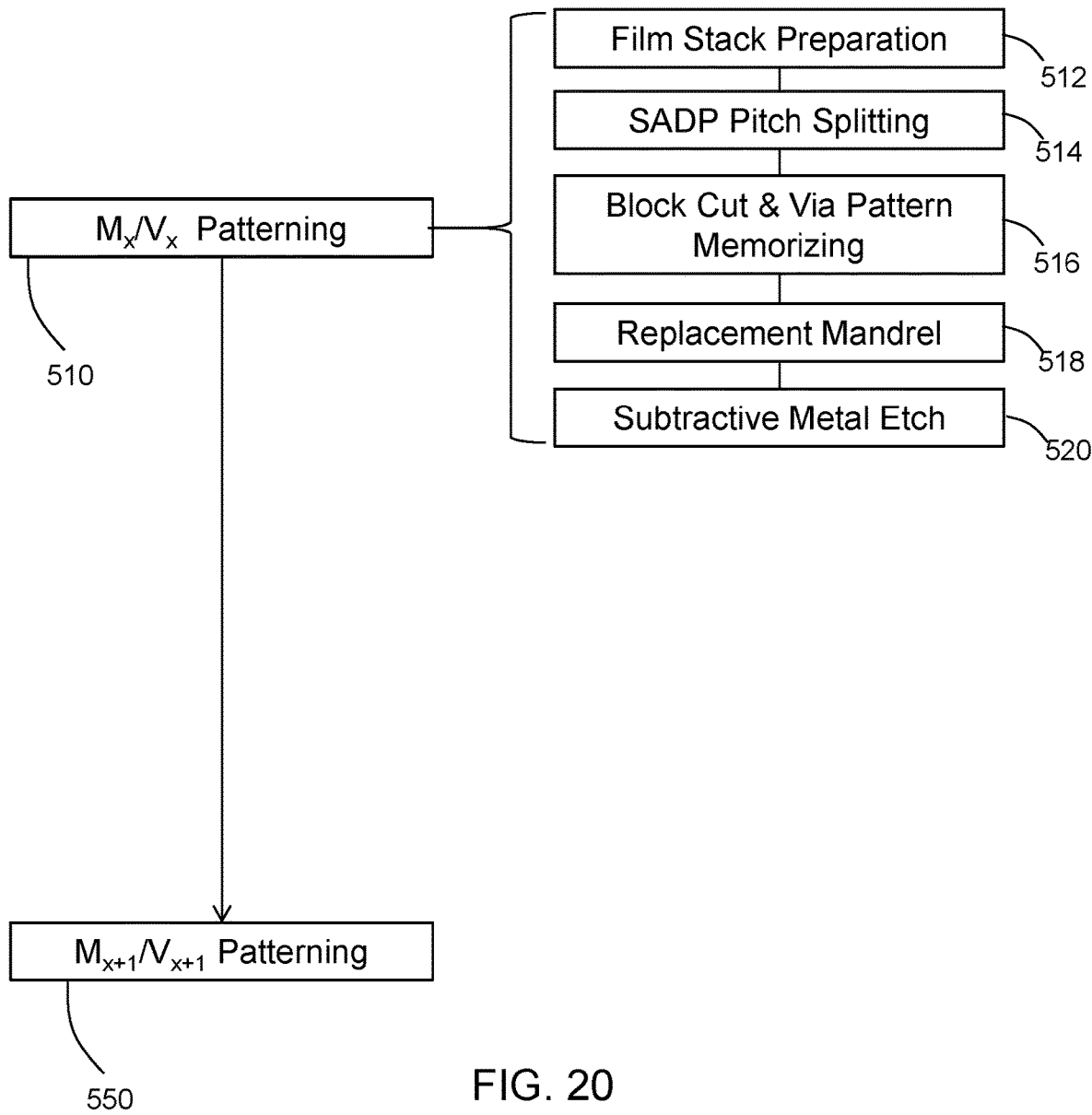
FIG. 20 illustrates a process flow diagram of a method according to one or more embodiments.

FIG. 20 illustrates a process flow diagram of a method 500 according to one or more embodiments. In one or more embodiments, the method comprises operation 510 which is $M_x/V_x$ patterning and operation 550 which is $M_{x+1}/V_{x+1}$ patterning. In one or more embodiments, operation 510 comprises at operation 512 film stack preparation, followed by at operation 514 SADP pitch splitting, followed by at operation 616 block cut and via pattern memorizing, followed by operation 518 replacement mandrel formation, and operation 520 subtractive metal etch. In one or more embodiments, operation 512 film stack preparation comprises forming a $V_x/M_x$ stack with an etch stop layer in between the Vx and Mx stack, a lower hard mask stack and an upper hard mask stack, and a SADP mandrel film. In one or more embodiments, operation 514 SADP pitch splitting comprises mask $M_{x-0}$ mandrel (MN) formation and spacer (SP) deposition and etch-back. In one or more embodiments, operation 516 block cut and via pattern memorizing comprises mask block-cut the NM portion $M_{x-C1}$, memorized by HM, mask via the NM portion $V_{x-1}$, memorized by HM, NM (non-Mandrel) gap-fill/CMP, MN removal, mask block-cut the MN portion $M_{x-C2}$, memorized by HM, mask via the NM portion $V_{x-2}$, and memorized by HM. In one or more embodiments operation 518 forming the replacement mandrel (rMN) comprises mandrel gap-fill/CMP, spacer removal (tone reverse), and trench formation in HM. In one or more embodiments, operation 510 subtractive metal etch comprises cut pattern being transferred into $V_x$, cut pattern being transferred into $M_x$, concurrently via into $V_x$, and low-k gap fill and CMP.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:
forming a first set and second set of mandrel and spacer lines extending along a first direction on a film stack comprising a metal stack with a hard mask stack on the metal stack, each of the first set and second set of mandrel and spacer lines including a mandrel line with a spacer line on either side thereof, the first set and second set separated by a gap exposing a top surface of the hard mask stack;
memorizing a first cut location into a first material of the hard mask stack;
forming a second hard mask to protect the first cut location and define a via location spaced a distance along the first direction from the first cut location;
removing the second hard mask and extending the first cut location into a second material of the hard mask stack, the second material etch selective to the first material and spaced from the first material by a dielectric material, and memorize the via location in the first material;
depositing a material in the gap between the first set and second set of mandrel and spacer lines;
removing the mandrel lines from the first set and second set of mandrel and spacer lines to form mandrel openings;
memorizing a second cut location into the first material of the hard mask stack;
forming a third hard mask to protect the second cut location and define a second via location spaced a distance along the first direction from the second cut location;
removing the third hard mask and extending the second cut location into the second material of the hard mask stack and memorize the second via location in the first material;
forming replacement mandrel lines in the mandrel openings; and
removing the spacer lines, first material, dielectric material and second material of the hard mask stack to form a trench between the first cut location and second cut locations.

2. The method of claim 1, wherein the first set and the second set of mandrel lines independently comprise one or more of an organic planarizing layer (OPL), an advanced pattern film (APF), amorphous silicon, or a spin-on hardmask (SOH).

3. The method of claim 1, wherein the first set and second set of spacer lines independently comprising one or more of amorphous silicon, silicon oxide, silicon nitride or metal oxide.

4. The method of claim 1, wherein the film stack comprises one or more of a tetraethylorthosilicate layer, a silicon oxynitride layer, a titanium nitride layer, a tantalum nitride layer, a metallization layer, an aluminum oxide layer, and a silicon nitride layer.

5. The method of claim 4, wherein the metallization layer comprises ruthenium (Ru).

6. A method of forming a semiconductor device, the method comprising:
forming a metal stack;
forming a hard mask stack on the metal stack, the hard mask stack comprising a first material and a second material;
forming a first set and second set of mandrel and spacer lines extending along a first direction on the hard mask stack on the metal stack, each of the first set and second set of mandrel and spacer lines including a mandrel line with a spacer line on either side thereof, the first set and second set separated by a gap exposing a top surface of the hard mask stack;
memorizing a first opening into the first material of the hard mask stack;
forming a second hard mask to fill the first opening and form a via location spaced a distance along the first direction from the first opening;
removing the second hard mask and extending the first opening into the second material of the hard mask stack, the second material etch selective to the first material and spaced from the first material by a dielectric material, and memorize the via location in the first material;
depositing a gap fill in the gap between the first set and second set of mandrel and spacer lines;
removing the mandrel lines from the first set and second set of mandrel and spacer lines to form mandrel openings;
memorizing a second opening into the first material of the hard mask stack;
forming a third hard mask to fill the second opening and define a second via location spaced a distance along the first direction from the second opening;
removing the third hard mask and extending the second opening into the second material of the hard mask stack and memorizing the second via location in the first material;
forming replacement mandrel lines in the mandrel openings; and
removing the spacer lines, first material, dielectric material and second material of the hard mask stack to form a trench between the first opening and the second opening.

7. The method of claim 6, wherein the first set and the second set of mandrel lines independently comprise one or more of an organic planarizing layer (OPL), an advanced pattern film (APF), or a spin-on hardmask (SOH).

8. The method of claim 6, wherein the first set and second set of spacer lines independently comprising one or more of amorphous silicon, silicon oxide, silicon nitride or metal oxide.

9. The method of claim 6, wherein the metal stack comprises one or more of a tetraethylorthosilicate layer, a barrier layer, and a metallization layer.

10. The method of claim 9, wherein the metallization layer comprises ruthenium (Ru).

11. The method of claim 6, wherein the first material and the second material independently comprises one or more of a titanium nitride layer and an aluminum oxide layer.

12. The method of claim 6, wherein the dielectric material comprises one or more of a silicon nitride layer or a silicon oxynitride layer.

13. A non-transitory computer readable medium including instructions, that, when executed by a controller of a processing chamber, causes the processing chamber to perform operations of:
form a first set and second set of mandrel and spacer lines extending along a first direction on a film stack comprising a metal stack with a hard mask stack on the metal stack, each of the first set and second set of mandrel and spacer lines including a mandrel line with a spacer line on either side thereof, the first set and second set separated by a gap exposing a top surface of the hard mask stack;

memorize a first cut location into a first material of the hard mask stack;

form a second hard mask to protect the first cut location and define a via location spaced a distance along the first direction from the first cut location;

remove the second hard mask and extending the first cut location into a second material of the hard mask stack, the second material etch selective to the first material and spaced from the first material by a dielectric material, and memorize the via location in the first material;

deposit a material in the gap between the first set and second set of mandrel and spacer lines;

remove the mandrel lines from the first set and second set of mandrel and spacer lines to form mandrel openings;

memorize a second cut location into the first material of the hard mask stack;

form a third hard mask to protect the second cut location and define a second via location spaced a distance along the first direction from the second cut location;

remove the third hard mask and extending the second cut location into the second material of the hard mask stack and memorize the second via location in the first material;

form replacement mandrel lines in the mandrel openings; and remove the spacer lines, first material, dielectric material and second material of the hard mask stack to form a trench between the first cut location and second cut locations.

14. The non-transitory computer readable medium of claim 13, wherein the first set and the second set of mandrel lines independently comprise one or more of an organic planarizing layer (OPL), an advanced pattern film (APF), amorphous silicon, or a spin-on hardmask (SOH).

15. The non-transitory computer readable medium of claim 13, wherein the first set and second set of spacer lines independently comprising one or more of amorphous silicon, silicon oxide, silicon nitride or metal oxide.

16. The non-transitory computer readable medium of claim 13, wherein the film stack comprises one or more of a tetraethylorthosilicate layer, a silicon oxynitride layer, a titanium nitride layer, a tantalum nitride layer, a metallization layer, an aluminum oxide layer, and a silicon nitride layer.

17. The non-transitory computer readable medium of claim 16, wherein the metallization layer comprises ruthenium (Ru).

18. The non-transitory computer readable medium of claim 13, wherein the metal stack comprises one or more of a tetraethylorthosilicate layer, a barrier layer, and a metallization layer.

19. The non-transitory computer readable medium of claim 13, wherein the first material and the second material independently comprises one or more of a titanium nitride layer and an aluminum oxide layer.

20. The non-transitory computer readable medium of claim 13, wherein the dielectric material comprises one or more of a silicon nitride layer or a silicon oxynitride layer.

* * * * *